United States Patent
Bachman et al.

(10) Patent No.: US 7,328,830 B2
(45) Date of Patent: Feb. 12, 2008

(54) STRUCTURE AND METHOD FOR BONDING TO COPPER INTERCONNECT STRUCTURES

(75) Inventors: Mark Adam Bachman, Sinking Spring, PA (US); Daniel Patrick Chesire, Winter Garden, FL (US); Sailesh Mansinh Merchant, Breinigsville, PA (US)

(73) Assignee: Agere Systems Inc., Allentown, PA (US)

( * ) Notice: Subject to any disclaimer, the term of this patent is extended or adjusted under 35 U.S.C. 154(b) by 390 days.

(21) Appl. No.: 10/741,155

(22) Filed: Dec. 19, 2003

(65) Prior Publication Data

US 2004/0182915 A1    Sep. 23, 2004

Related U.S. Application Data

(60) Provisional application No. 60/435,033, filed on Dec. 20, 2002.

(51) Int. Cl.
*B23K 31/02* (2006.01)
(52) U.S. Cl. .................... 228/180.21; 228/180.22; 228/220
(58) Field of Classification Search ................ 228/220
See application file for complete search history.

(56) References Cited

U.S. PATENT DOCUMENTS

| | | | | |
|---|---|---|---|---|
| 4,921,157 A * | 5/1990 | Dishon et al. | ........... | 228/124.1 |
| 5,502,337 A | 3/1996 | Nozaki | | |
| 6,092,714 A * | 7/2000 | Casey | ........... | 228/205 |
| 6,174,823 B1 * | 1/2001 | Dobson et al. | ........... | 438/778 |
| 6,177,347 B1 * | 1/2001 | Liu et al. | ........... | 438/675 |
| 6,204,192 B1 * | 3/2001 | Zhao et al. | ........... | 438/723 |
| 6,207,551 B1 * | 3/2001 | Chungpaiboonpatana et al. | ........... | 438/617 |
| 6,319,842 B1 | 11/2001 | Khosla et al. | | |
| 6,455,913 B2 * | 9/2002 | Yeh et al. | ........... | 257/529 |
| 6,541,366 B1 * | 4/2003 | Chin et al. | ........... | 438/613 |
| 6,693,020 B2 * | 2/2004 | Mui et al. | ........... | 438/475 |
| 6,805,279 B2 * | 10/2004 | Lee et al. | ........... | 228/220 |
| 6,886,735 B2 * | 5/2005 | Jeng et al. | ........... | 228/180.5 |

(Continued)

FOREIGN PATENT DOCUMENTS

EP    1 041 614 A1    10/2000

(Continued)

OTHER PUBLICATIONS

Nitrogen, "Molecular nitrogen (gas and liquid)," Wikipedia Encyclopedia, http://en.wikipedia.org/wikki/Nitrogen, p. 1, access date Sep. 8, 2006, no publication date available.*

*Primary Examiner*—Kiley Stoner (57) ABSTRACT

An integrated circuit structure and a method for fabricating the structure. The method comprises forming a copper bond pad for attaching the integrated circuit to a package. Copper oxide is removed from the pad by reduction in a hydrogen ion atmosphere. For attaching the integrated circuit to a bump-bonding package an under-bump metallization layer is formed over the reduced copper pad and a solder bump formed thereover. The process can also be employed in a wire bonding process by forming an aluminum layer overlying the cleaned copper pad. The structure of the present invention comprises a copper pad formed in a substrate. A passivation layer defining an opening therein overlies the copper pad. A under-bump metallization layer is disposed in the opening and a solder bump overlies the metallization layer. Alternatively, the structure further comprises an aluminum pad disposed overlying the reduced copper pad.

16 Claims, 9 Drawing Sheets

U.S. PATENT DOCUMENTS

| | | |
|---|---|---|
| 2001/0010407 A1 | 8/2001 | Ker et al. |
| 2001/0046721 A1* | 11/2001 | Stierman et al. .............. 438/14 |
| 2001/0053600 A1* | 12/2001 | Morales et al. ............. 438/627 |
| 2002/0043727 A1 | 4/2002 | Wu |
| 2002/0056740 A1* | 5/2002 | Hayashi ................... 228/110.1 |
| 2002/0086520 A1* | 7/2002 | Chiang ....................... 438/630 |
| 2002/0121703 A1* | 9/2002 | Toyoda et al. .............. 257/762 |
| 2004/0000580 A1* | 1/2004 | Lee et al. ................... 228/220 |

FOREIGN PATENT DOCUMENTS

| | | |
|---|---|---|
| EP | 1 111 356 A2 | 6/2001 |
| WO | WO 02/46489 | 6/2002 |

* cited by examiner

STRUCTURE AND METHOD FOR BONDING TO COPPER INTERCONNECT STRUCTURES

This patent application claims the benefit of the provisional patent application filed on Dec. 20, 2002, and assigned application Ser. No. 60/435,033.

BACKGROUND OF THE INVENTION

Integrated circuits (or chips) comprise a silicon substrate and semiconductor devices, such as transistors, formed from doped regions within the substrate. A conductive interconnect system overlying the substrate electrically connects the doped regions to form electrical circuits.

A conventional interconnect system comprises a plurality of substantially vertical conductive vias or plugs interconnecting one or more substantially horizontal conductive layers (each horizontal layer referred to as an "M" or metallization layer), with a dielectric layer disposed between two vertically adjacent conductive layers. A typical interconnect system comprises 6-9 horizontal conductive layers, each further comprising a plurality of conductive lines or traces. Conductive vias in the first or lowest interconnect level connect underlying semiconductor device regions to overlying conductive layers. Upper level conductive vias interconnect two vertically adjacent conductive layers. The conductive vias and the conductive lines are formed by employing conventional techniques, including metal deposition, photolithographic masking, patterning and subtractive etching. Most integrated circuits employ tungsten conductive vias and aluminum conductive layers.

After fabrication, the integrated circuit is enclosed in a package comprising a plurality of externally-disposed pins or other conductive elements for connecting the packaged chip to electronic components in an electronic device. To connect the integrated circuit to die package pins, an uppermost conductive layer of the chip interconnect system comprises a plurality of conductive bond pads (referred to as the bond pad layer) for receiving a conductive element (e.g., a bond wire, solder bump or solder ball) that connects the integrated circuit to the package pins. In an aluminum-based interconnect system, the topmost aluminum layer is masked, patterned, and etched to define the aluminum bond pads therein.

Figure 1:
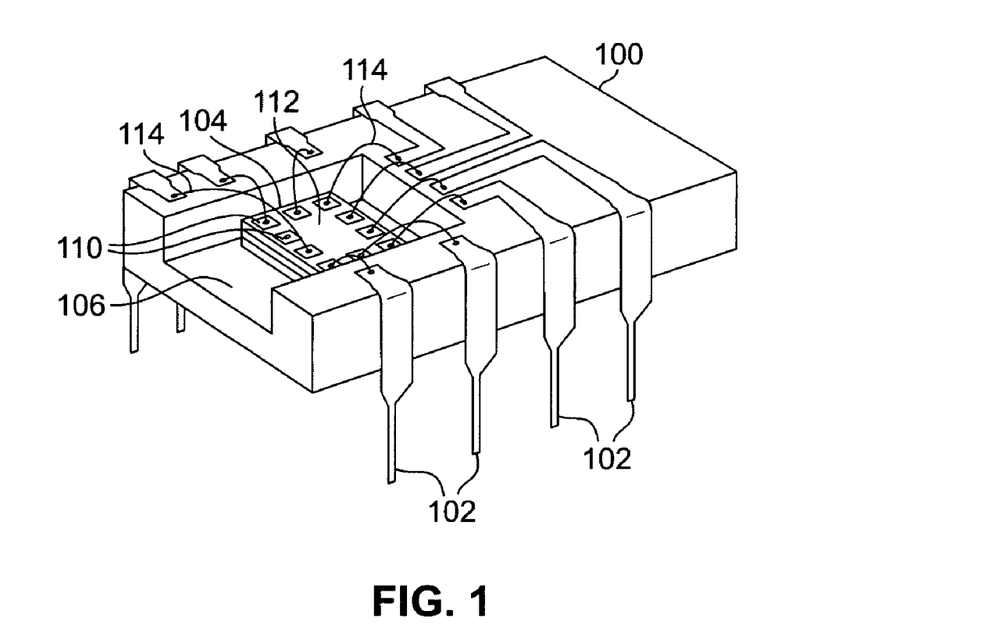
FIG. 1 is a perspective cut-away view of a wire bond package for an integrated circuit.

FIG. 1 illustrates a device package 100 comprising package leads 102. An integrated circuit 104 is affixed within a die attach area 106. Bond pads 110 (in one embodiment formed from aluminum) disposed on an upper surface 112 of the integrated circuit 104 are connected to the package leads 102 by gold (or gold alloy) wires 114. Generally, the bond pads 110 vary between about 40-80 microns and 50-150 microns in length and width, respectively. Although square bond pads as illustrated are common, use of rectangular bond pads is also known in the prior art. The process of electrically connecting the bond pads 110 to the package leads 102 is referred to as wire bonding.

Figure 2:
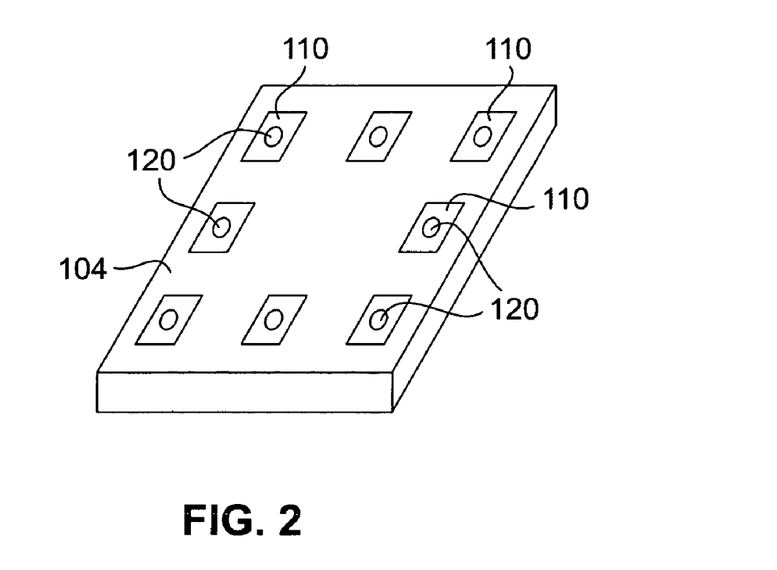
FIGS. 2 and 3 illustrate a flip-chip integrated circuit device structure.
Figure 3:
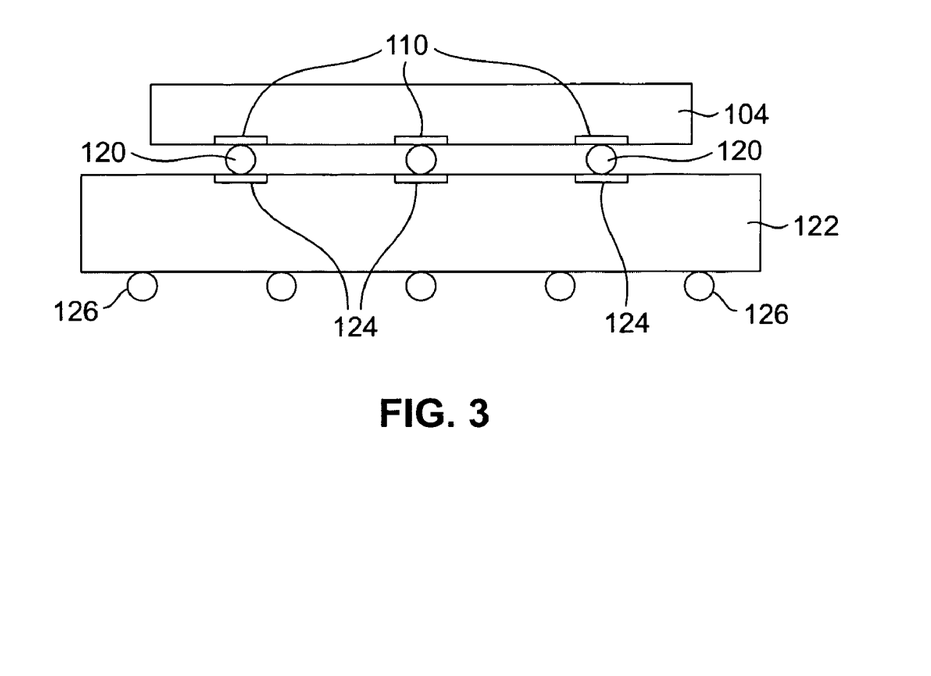

In another known package structure, referred to as flip-chip or bump bonding, the interconnecting bond wires are replaced with deposited solder bumps 120 formed on the bond pads 110 of the integrated circuit 104. See FIG. 2. Conventionally, an under-bump metallization layer (not shown) is formed intermediate the solder bumps 120 and the bond pads 110. Connection to a package 122 of FIG. 3 is accomplished by inverting the integrated circuit 104 and soldering the bumps 120 to receiving pads 124 on the package 122. The receiving pads 124 are in conductive communication with a corresponding package lead. In the example of FIG. 3 the package leads comprise an array of balls 126 in the form of a ball grid array. Thus integrated circuits formed with an aluminum interconnect system and aluminum bond pads 110 can be packaged using either the wire bond or bump bond process.

As integrated circuit devices and interconnect systems are reduced in size and made to carry higher frequency analog signals and higher data-rate digital signals, aluminum interconnect structures can impose unacceptable signal propagation delays within the chip. Also, as via openings continue to shrink it becomes increasingly difficult to deposit conductive material in the smaller openings.

Given these known disadvantages of aluminum interconnect structures, copper (and its alloys) is becoming the interconnect material of choice. Copper is a better conductor than aluminum (with a resistivity of 1.7 to 2.0 micro-ohm-cm compared to 2.7 to 3.1 micro-ohm-cm for aluminum), is less susceptible to electromigration (a phenomenon whereby an aluminum interconnect line thins and can eventually separate due to the electric field and thermal gradients formed by current flow through the line), and can be deposited at lower temperatures (thereby avoiding deleterious effects from high thermal budgets) and in smaller openings. The lower resistance of copper reduces signal propagation time. Moreover, recent advances in electroplating and electrodeposition make the process of depositing copper quite economical.

A dual damascene process, one preferred technique for forming a copper interconnect system, integrally forms both the conductive vertical via portion and the conductive horizontal interconnect portion of a copper metallization layer. A via is formed in a dielectric layer, followed by formation of an overlying horizontal trench. A metal deposition step simultaneously fills both the via and the trench, forming a complete metal interconnect layer comprising a substantially vertical conductive via and a substantially horizontal conductive runner. A chemical/mechanical-polishing step planarizes the dielectric surface by removing copper deposits formed on the surface during the copper deposition step.

Figure 4:
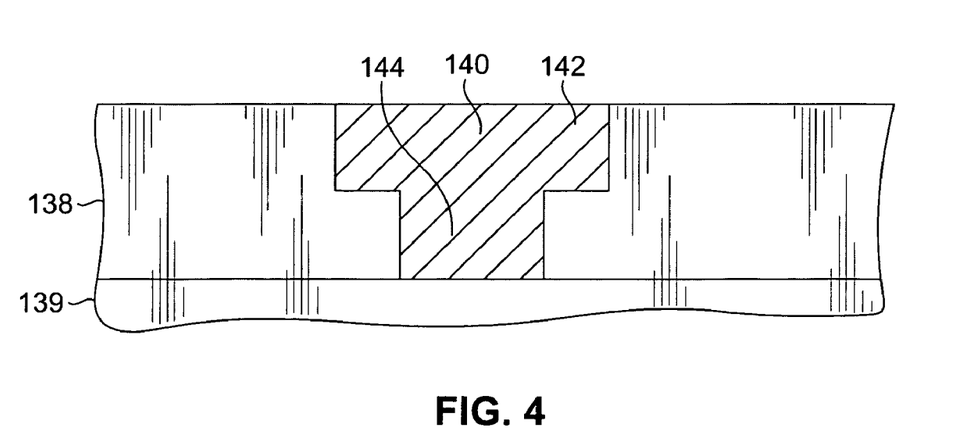
FIG. 4 is a cross-sectional view illustrating a dual damascene interconnect structure.

An example of a prior art damascene structure is illustrated in the cross-sectional view of FIG. 4, comprising a dielectric layer 138 deposited or formed on a lower level interconnect structure 139. An opening formed in the dielectric layer 138 is filled with a suitable conductive material 140, such as copper, to form a conductive trench 142 and a conductive via 144 in contact with the lower level interconnect structure 139. The topmost metallization layer is used to fabricate copper bond pads as is well known in the art.

Although attempts have been made to wire bond to copper bond pads, these efforts remain an academic exercise and have not been implemented in commercial fabrication processes. Instead, the industry employs the flip-chip solder bump method for connecting copper bond pads to flip-chip package leads. However, if it is desired to use a wire bond package for an integrated circuit having a copper interconnect system, aluminum bond pads are fabricated over and in conductive communication with the copper interconnect structures. Bond wires can be bonded to the aluminum bond pads. Alternatively, a solder bump can be bonded to the aluminum bond pad for use with a flip chip package.

In the integrated circuit fabrication industry, a significant fraction of fabricated chips are shipped to a separate facility for packaging or preparing the wafers for subsequent assembly, according to the wire bonding or the flip-chip techniques described above. The facility is generally operated by a third-party contractor. Transportation of wafers from the manufacturing site to the packaging facility may take a few days to several weeks. Depending on market conditions and demand, the wafers may then be stored in inventory, typically for a few months, before packaging.

It is known that copper forms an oxide and corrodes when exposed to an ambient atmosphere. Thus during shipment and storage at the packaging facility, exposed copper pads will oxidize. The copper corrosion process is not self-limiting (i.e., the corrosion and oxidation continue indefinitely) and forms a complex array of oxides on the copper surface. The longer the exposure duration, the greater the propensity for an exposed copper pad to undergo such chemical changes. Since the copper oxide continues to grow without limit, the oxide depth is unknown and any cleaning process employed to remove the copper oxide may not remove all of the oxide.

To prevent oxide formation on the copper bond pads, prior to shipping the wafer to the packaging facility a semiconductor manufacturer forms an aluminum alloy layer (e.g., aluminum-copper, aluminum-silicon-copper) overlying the copper pad. The aluminum promotes formation of the self-passivating aluminum-oxide layer described above and substantially limits copper oxide formation. However, forming the aluminum layer adds two mask steps to the fabrication process. It is known that each mask layer can increase wafer cost and fabrication cycle time and lower the process yield. Thus semiconductor manufacturers seek to limit mask steps. If the semiconductor manufacturer elects not to form an aluminum layer over the copper bond pads, it will be necessary to form the aluminum layer prior to the bumping step for forming solder bumps. This would require cleaning of the copper oxide prior to packaging.

To summarize, according to the prior art, integrated circuits formed with an aluminum interconnect system and aluminum bond pads can be packaged using either the wire bond or bump bond process. Only minimal cleaning of the aluminum surface is required prior to packaging. For a copper interconnect system, the semiconductor fabricator can deposit an aluminum layer over the copper bond pads to limit copper oxide formation during shipping and storage prior to packaging, at the expense of two additional mask steps. With the aluminum layer in place, either wire bonding or flip chip packaging can be employed. According to another process, the fabricator ships the integrated circuits with exposed copper bond pads, necessitating a cleaning step prior to bumping and subsequent packaging. After cleaning, bump bonds are formed and the integrated circuit packaged in a bump bond package.

Figure 5:
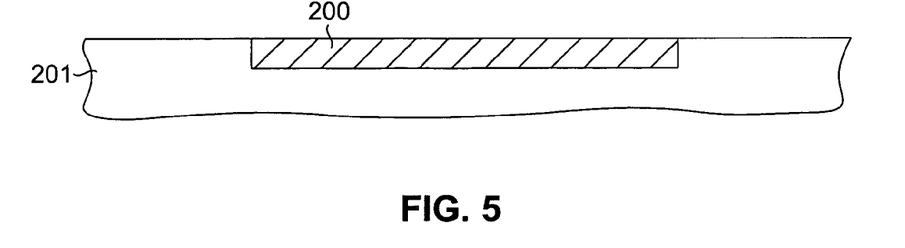
FIGS. 5-10 are cross-sectional views taken along a common plane illustrating sequential processing steps in the fabrication of a prior art solder bump structure.

Beginning in FIG. 5, there is illustrated one prior art process for forming an aluminum layer and solder bumps for a copper interconnect structure, including the aforementioned copper oxide cleaning step. A copper bond pad 200 is formed within a trench or opening of a substrate 201 as shown. As described above, the substrate 201 comprises multiple alternating layers of dielectric and interconnects overlying a semiconductor substrate comprising doped regions.

A passivation stack 202 (typically a stack of dielectric material layers comprising silicon dioxide and/or silicon nitride) is formed over the bond pad 200. A photoresist layer (not shown in FIG. 5) is deposited, masked, patterned and developed to create an opening therein. An opening 204 is then formed in the passivation stack 202 according to the pattern in the photoresist layer. See FIG. 6.

Figure 6:
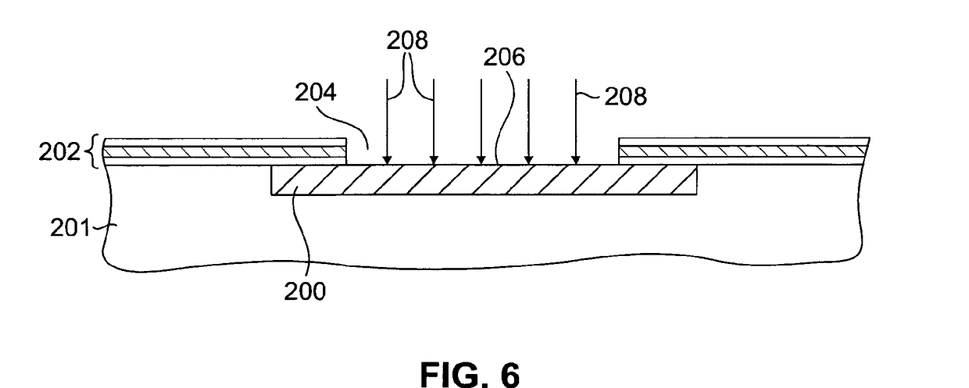

Copper oxide on a surface 206 of the copper pad 200 is removed during a sputter clean process (also referred to as a back sputter process) wherein energetic argon ions (produced in a radio-frequency back sputter tool) represented by arrowheads 208 in FIG. 6, impinge upon the copper pad 200 through the opening 204.

Figure 7:
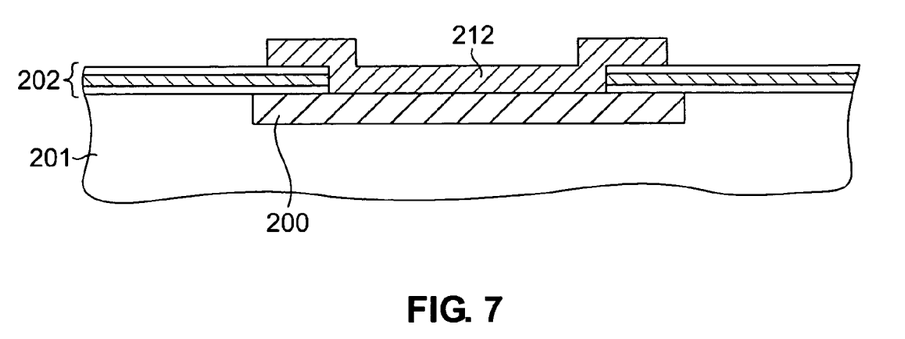

An aluminum layer is deposited and etched according to a mask pattern (not shown), forming an aluminum pad 212 as illustrated in FIG. 7. This step represents a first one of the two required additional mask layers referred to above. At the interface between the copper pad 200 and the aluminum pad 212, intermetallic compounds can be formed as metal atoms of one material diffuse into the other material. Such intermetallic compounds may be brittle and susceptible to cracking, causing irregularities in the interface conductivity and degrading device performance. To avoid the formation of the intermetallic layer, a barrier layer (not shown in FIG. 7) is formed between the aluminum pad 212 and the copper pad 200. Exemplary materials comprising the barrier layer include: tantalum, tantalum-nitride and titanium nitride.

Figure 8:
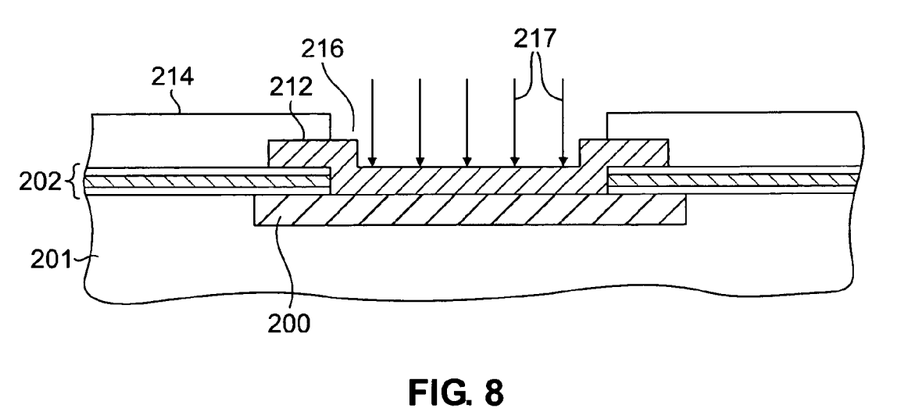

A passivation layer 214 (see FIG. 8) is formed and patterned, defining an opening 216 according to a patterned photoresist layer (not shown in FIG. 8). This photoresist step represents a second of the two required additional mask layers.

Hence, either the semiconductor fabrication facility or the bumping house forms aluminum pads over the copper bond pads, as described above. The wafer is delivered for solder bump formation with exposed aluminum pads. The first process performed in a bump-bonding packaging operation is cleaning of the aluminum pad 212. In this cleaning step argon ions, represented by arrowheads 217 in FIG. 8, are produced in a radio-frequency (RF) back-sputtering tool and impinge upon the aluminum pad 212 to reduce any aluminum oxide formed thereon. This oxide removal step is typically carried out in the same sputter deposition tool where the under-bump metallization (UBM) material is deposited, as described below.

Prior to formation of the UBM layer, sometimes the bumping house prefers to deposit an additional aluminum layer on the aluminum pad 212 to present a clean surface for the UBM layer. Another mask step is required to form this aluminum layer, thus increasing the cost and process cycle time.

Figure 9:
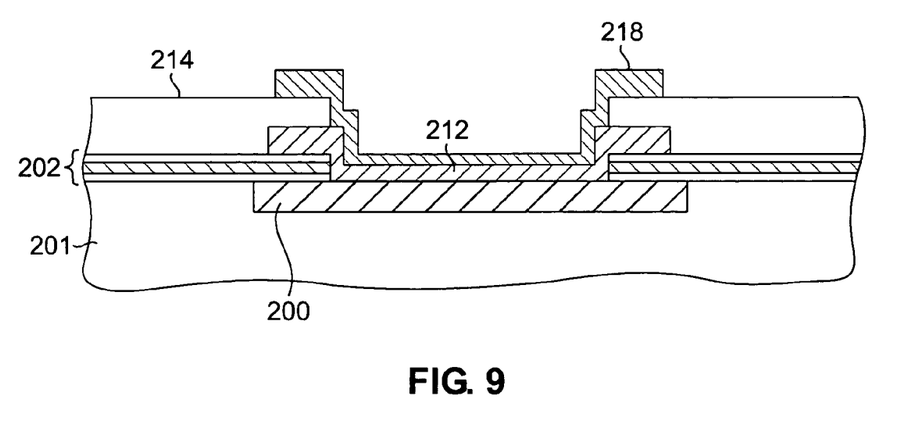
Figure 10:
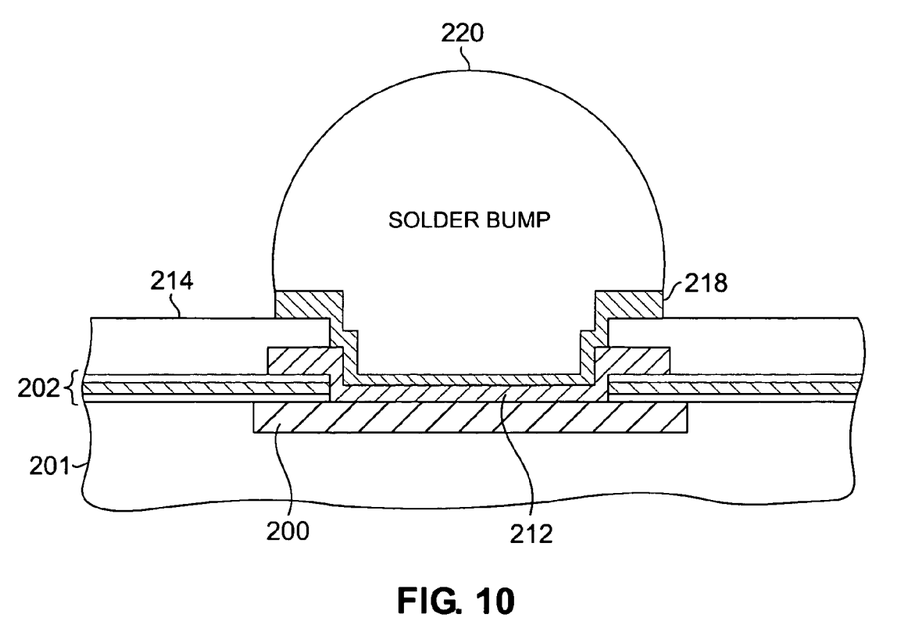

An under-bump metallization layer 218 (see FIG. 9) is formed and patterned according to a mask layer pattern not shown in FIG. 9. Exemplary compounds for the UBM layer 218 comprise: titanium-nickel-vanadium or copper-chromium-nickel. A solder bump 220 is formed by conventional techniques overlying the under-bond metallization layer 218 as shown in FIG. 10.

In a wire bonding process, the under-bump metallization layer is not required. Instead, a wire bond is formed on the aluminum pad 212 to connect the integrated circuit to the package.

It is known that the conventional RF back-sputtering process (as described above in conjunction with the FIG. 6) for removing oxide (and other surface films) from the copper pad 200 can cause significant damage to the integrated circuit and the copper film surface. This damage results from the energy imparted to the surface by the energetic argon ions represented by the arrowheads 208 in FIG. 6. The surface of the copper bond pad 200 may be significantly roughened, making it difficult for the subsequent aluminum layer 212 to nucleate and grow adequately on the pad 200. Therefore, the device performance may be degraded when the RF back-sputtering process is used to clean the oxidized copper surface. In the worst case, wafer plasma damage can occur, rendering the device useless.

BRIEF SUMMARY OF THE INVENTION

The present invention comprises a method for forming a solder bond on a copper surface, comprising forming the copper surface, wherein unwanted copper oxide forms on the copper surface. The copper surface is reduced the copper oxide and the solder bond formed on the reduced copper surface.

The invention further comprises a solder bond structure comprising a substrate and a hydrogen-reduced copper pad overlying the substrate. A passivation layer having an opening defined therein overlies the copper pad. An under-bump metallization layer is disposed within the opening and the solder bond structure is disposed overlying the under-bump metallization layer.

BRIEF DESCRIPTION OF THE DRAWINGS

The present invention can be more easily understood and the advantages and uses thereof more readily apparent, when considered in view of the following detailed description when read in conjunction with the following figures wherein.

In accordance with common practice, the various described device features are not drawn to scale, but are drawn to emphasize specific features relevant to the invention. Reference characters denote like elements throughout the figures and text.

DETAILED DESCRIPTION OF THE INVENTION

Before describing in detail the particular copper oxide cleaning process and a structure so formed in accordance with the present invention, it should be observed that the present invention resides primarily in a novel and non-obvious combination of elements and method steps. Accordingly, these elements and steps have been represented by conventional elements and steps in the drawings, showing only those specific details that are pertinent to the present invention so as not to obscure the description with structural details that will be readily apparent to those skilled in the art having the benefit of the description herein.

According to the teachings of the present invention, the prior art step of RF back-sputtering is replaced with a cleaning method that employs a reducing atmosphere to remove oxidation from a copper bond pad of an integrated circuit. In one embodiment the reducing atmosphere comprises a plasma containing hydrogen ($H_2$) or ammonia ($NH_3$) (or another hydrogen-containing species). The proposed cleaning step can be carried out in the conventional RF back sputtering chamber, with minor hardware modifications, at very small additional cost, thus eliminating the need to purchase new equipment. The teachings of the invention are also applicable to the removal of oxides from other surfaces. In one embodiment the reducing process of the present invention is employed prior to formation of a UBM layer over which a solder bump is formed for bump bonding the integrated circuit to a package.

Because the process of the present invention relies on chemical reduction to remove the copper oxide, rather than bombardment of the oxide by energetic ions as disclosed in the prior art, bond pad damage is significantly reduced when compared with the prior art bombardment process. Moreover, there is reduced roughening of the pad surface and a lower interfacial resistance between the cleaned copper pad and the UBM layer formed thereover (or any layer formed over a metallic pad cleaned according to the present invention), both features promoting improved circuit performance.

According to the prior art process, as the energetic ions bombard the copper pad surface to remove the oxide, copper is also sputtered from the surface. The sputtered copper re-deposits back on the wafer, developing current leakage paths on the surface of the dielectric material in which the copper bond pad is formed. This phenomenon is substantially reduced according to the present invention as little copper is sputtered from the surface during the novel cleaning process. These and other advantages offered by the present invention improve the reliability of an integrated circuit cleaned according to the teachings of the present invention. Also, according to the present invention, two mask layers in the prior art process are avoided and one metal deposition step (formation of the aluminum pad overlying the copper pad) is eliminated.

According to one embodiment of the invention, an inert carrier gas, such as argon (Ar) or nitrogen ($N_2$) is used in a relatively small quantity, i.e., a sufficient quantity to strike a plasma in the chamber. Once the plasma stabilizes, the inert gas flow can be terminated. A preferred embodiment uses a flow rate ratio of the hydrogen-containing species to the carrier gas of about 1:1 to 10:1, preferably about 2:1.

An exemplary reduction reaction of the copper-oxide by the hydrogen-containing species is described by the following equations:

(a) An ionization step to form reactive $H^+$ ions from hydrogen-containing gas in plasma in a conventional RF back-sputter chamber. For example, if the hydrogen containing species is molecular hydrogen, the reaction is:

$$H_2 = 2H^+ \quad (1)$$

(b) A reduction of the oxide on top of copper pad by the $H^+$ ions:

$$Cu_xO + 2H^+ = Cu + H_2O \quad (2)$$

The present invention further comprises an in-line method for determining the process end-point by measuring the surface reflectivity of the copper bond pad both before and after the copper oxide reduction step. An oxidized copper film is about 40% to 80% less reflective than a film that has undergone the cleaning steps of the present invention. A freshly reduced copper oxide film according to the process of the present invention, exhibits film reflectivity that is similar to the reflectivity of freshly deposited copper, i.e., deposited using conventional sputter deposition techniques.

Figure 11:
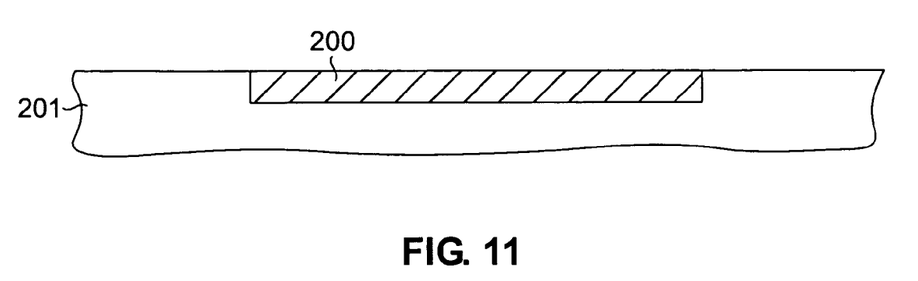
FIGS. 11-14 are cross-sectional views taken along a common plane illustrating sequential processing steps in the fabrication of a solder bump according to one embodiment of the present invention.

The structure and method of the present invention, as applied to bump bonding of an integrated circuit to a bumped package, is illustrated in FIGS. 11-14. As illustrated in FIG. 11, the copper bond pad 200 is formed within the substrate 201. As described above, the bond pad 200 provides an interconnection region between the devices of the integrated circuit and a conductive terminal of a package, such as the package 100 of FIG. 1 or the package 122 of FIG. 4A. The bond pad 200 can be formed according to known damascene or dual damascene techniques within a previously-formed via opening and/or trench in the substrate 201. Typically the bond pad 200 is formed by electrodepositing copper as explained above. Exemplary materials of the substrate 201 comprise, silicon dioxide-based materials, organo-silicate materials, silicates, fluorine-based dielectrics, low-dielectric constant materials such as xerogels, areogels and spin-on dielectrics, and combinations or multilayers thereof.

Figure 12:
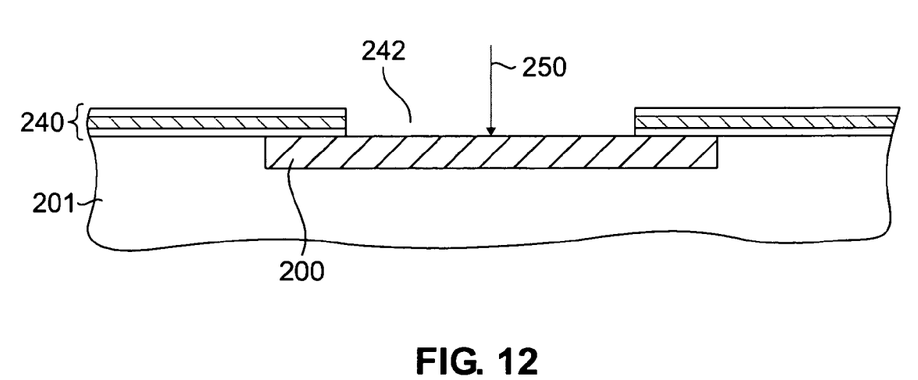

As illustrated in FIG. 12, a passivation layer 240 is formed overlying the bond pad 200 and patterned according to an opening in an overlying photoresist layer, not shown in FIG. 12, to form an opening 242 above the bond pad 200. Material of the passivation layer comprises silicon carbide, silicon nitride, silicon dioxide or combinations thereof, or any suitable material that can serve as a passivation layer.

An arrowhead 250 in FIG. 12 represent ions of a hydrogen-containing species contacting the copper pad 200, reducing the copper oxide according to equation (2) above. The reduction reaction can be performed, for example, in the same tool used to deposit the UBM layer according to the next step. Hydrogen is introduced into the chamber and ionized by the chamber plasma.

Figure 13:
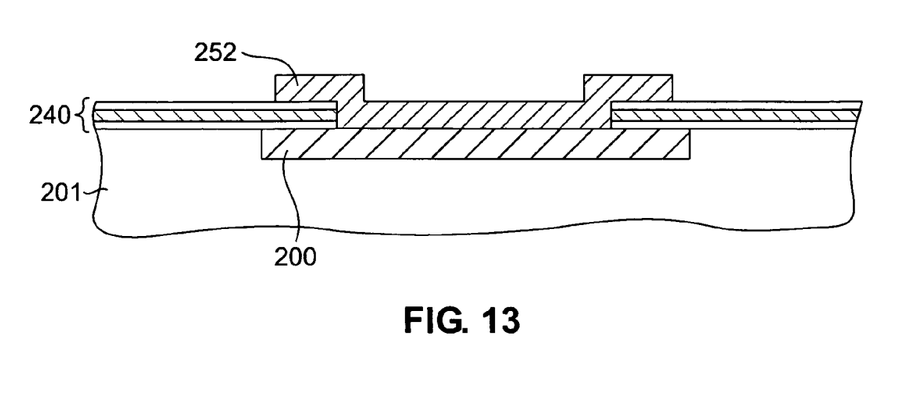

In FIG. 13, an under-bump metallization (UBM) layer 252 is formed. In one embodiment, a material of the UBM 252 may include known materials to prevent intermixing of copper in the copper pad 200 with a material from which the solder bump 220 (see FIG. 14) is formed. Candidate UBM layer materials comprise multilayer structures that include: copper and chromium, nickel-based materials, refractory metals and compounds of titanium, tantalum, molybdenum and tungsten.

Figure 14:
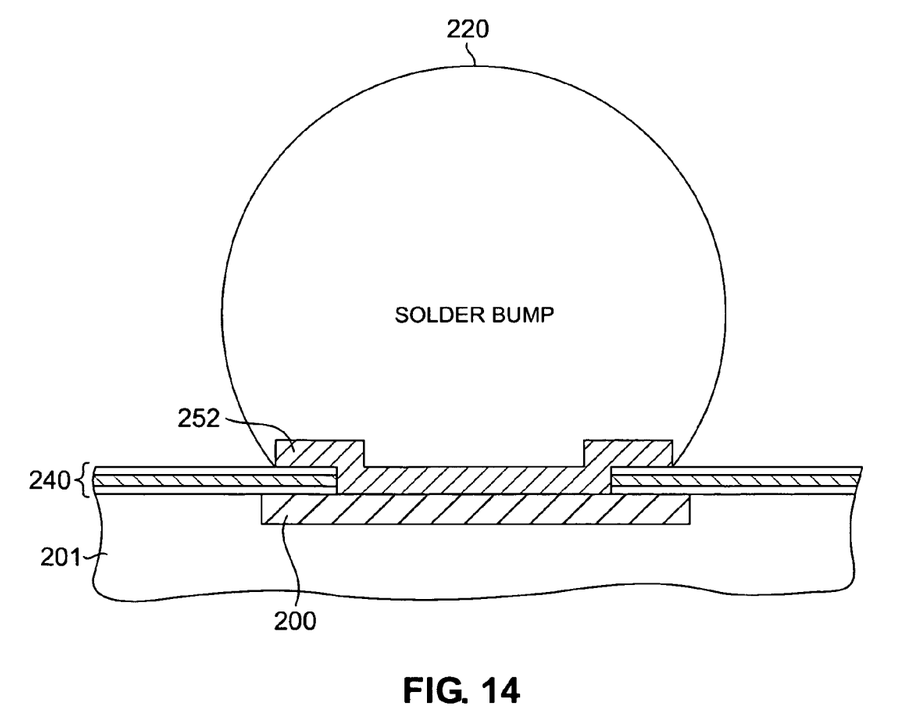

A reflow solder bump 220 is formed according to known methods on the copper pad 200, see FIG. 14. The solder bump 220 comprises lead-based or lead-free materials.

Although the present invention is executed without a sputtering component in the cleaning process, in another embodiment it may be advisable to include sputtering particles during the reduction process to, for example, remove any deposits from an upper surface of the passivation layer 240. Additional argon or nitrogen molecules can be added to provide the sputtering component.

Figure 15:
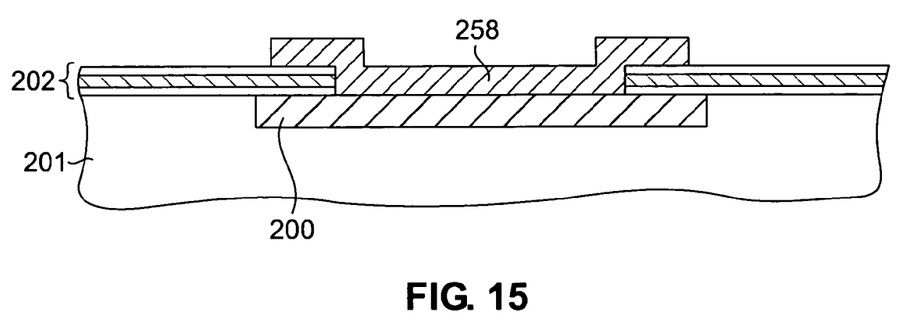
FIG. 15 is a cross-sectional view of an aluminum layer formed over a copper bond pad.

The teachings of the present invention have been described as applied to the formation of solder bump on a copper bond pad. The teachings can also be applied to the formation of any structure on a copper pad wherein it is first necessary to remove oxides from the copper pad surface. For example, the cleaning process of the present invention can be used to clean the copper surface prior to the formation of an aluminum pad thereon for wire bonding the integrated circuit to a wire-bond type package. See FIG. 15 wherein an aluminum layer 258 is formed over the copper pad 200 that has been previously cleaned according to the teachings of the present invention. The cleaning process of the present invention can also be applied to any metal surface over which it is desired to form a solder bond surface, i.e., a surface that will adhere to a solder material.

Figure 16:
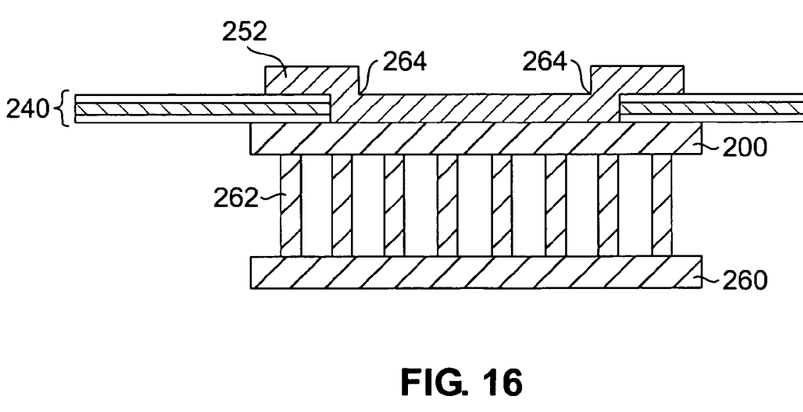
FIGS. 16 and 17 are cross-sectional views taken along a common plane illustrating sequential processing steps in the fabrication of a solder bump according to a second embodiment of the present invention.
Figure 17:
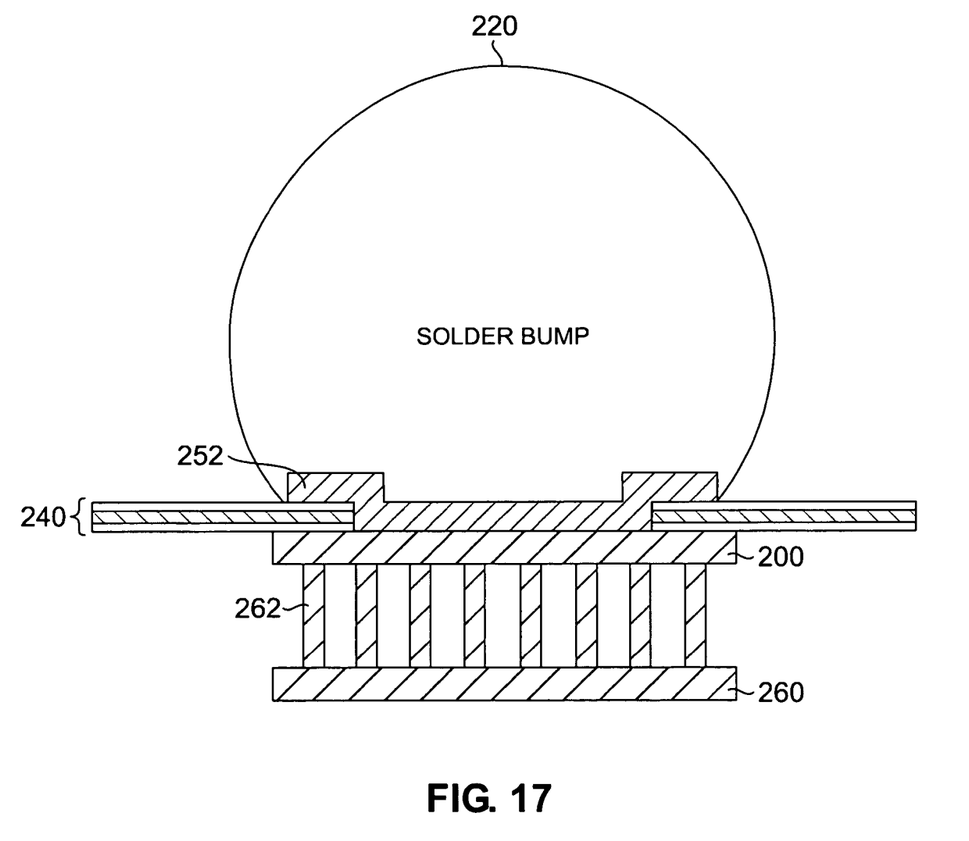

In yet another embodiment, illustrated in FIGS. 16 and 17, an interconnect structure 260 (for example, a power bus of an integrated circuit) is connected to the copper bond pad 200 through a plurality of vias 262 that provide electrical conductivity between the interconnect structure 260 and the bond pad 200. It is known that current crowding can occur in the regions 264 where the under-bump metallization layer 252 contacts the copper bond pad 200. The higher current flow in these regions 264 causes a material temperature increase, possibly leading to structural damage. The plurality of vias 262 provide multiple current paths to spread the current flow, reducing current crowding effects. Additionally, the plurality of vias 262 provide mechanical support for the bond pad 200, especially during a wire bonding process when downwardly directed forces are applied to any structure (such as an aluminum pad or solder bump) over the pad 200 during packaging and assembly.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its essential scope thereof Therefore, it is intended that the invention not be limited to the particular embodiment disclosed as the best mode contemplated for carrying out this invention, but that the invention will include all embodiments falling within the scope of the appended claims.

What is claimed is:

1. A method for forming a solder bond on a copper pad, comprising:
    forming the copper pad;
    forming a passivation layer over the copper pad;
    forming an opening in the passivation layer to expose a surface of the copper pad;
    determining a first surface reflectivity of the copper pad;
    subjecting the surface to a reducing agent and an inert carrier gas, subsequent to determining the first surface reflectivity of the copper pad, wherein a proportion of the reducing agent to the inert carrier gas is at least 2:1 to reduce copper oxide on the surface;
    determining a second surface reflectivity of the copper pad, subsequent to subjecting the surface to the reducing agent;
    controlling the reducing agent according to the first and second surface reflectivity; and
    forming the solder bond on the reduced surface.

2. The method of claim 1 wherein the step of forming the solder bond further comprises forming an under-bump metallization layer on the reduced surface.

3. The method of claim 2 further comprising forming a solder bump on the under-bump metallization layer.

4. The method of claim 1 wherein the step of forming the solder bond further comprises forming an aluminum layer on the reduced surface.

5. The method of claim 1 wherein the reducing agent comprises hydrogen ions.

6. The method of claim 5 wherein the step of subjecting the surface is carried out in a radio-frequency back sputter chamber.

7. The method of claim 5 wherein the step of subjecting the surface further comprises subjecting a hydrogen containing species to a plasma for forming the hydrogen ions from the hydrogen containing species.

8. The method of claim 1 wherein the copper pad is formed in a semiconductor substrate.

9. The method of claim 8 wherein the semiconductor substrate comprises interconnect structures, and wherein the copper pad is in conductive communication with at least one of the interconnect structures.

10. The method of claim 1 further comprising sputtering particles on the passivation layer and the surface.

11. The method of claim 10 wherein the step of sputtering particles further comprises sputtering argon ions.

12. The method of claims 1 wherein the copper pad is formed on an integrated circuit.

13. A method for forming a solder bond on a copper surface, comprising forming the copper surface, wherein unwanted copper oxide forms on the copper surface;

determining a first surface reflectivity of the copper surface;

subjecting the surface to a reducing agent and an inert carrier gas, subsequent to determining the first surface reflectivity of the copper pad, wherein a proportion of the reducing agent to the carrier gas is at least 2:1 to reduce the copper oxide;

determining a second surface reflectivity of the copper surface, subsequent to subjecting the surface to the reducing agent;

controlling the reducing agent in response to the surface reflectivity; and forming the solder bond on the reduced copper surface.

14. The method of claim 13 wherein the reducing step further comprises exposing the copper surface to hydrogen species ions.

15. The method of claim 14 wherein the exposing step further comprises reducing the copper oxide according to the equation, $Cu_xO+2H^+=Cu+H_2O$.

16. The method of claim 14 wherein the exposing step is carried out in a radio-frequency back sputter chamber.

* * * * *